(12) United States Patent
Ahn et al.

(10) Patent No.: US 11,217,464 B2
(45) Date of Patent: Jan. 4, 2022

(54) SYSTEM FOR TRANSFERRING MICRO LED

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: Point Engineering Co., Ltd., Asan (KR)

( * ) Notice: Subject to any disclaimer, the term of this patent is extended or adjusted under 35 U.S.C. 154(b) by 349 days.

(21) Appl. No.: 16/370,810

(22) Filed: Mar. 29, 2019

(65) Prior Publication Data
US 2019/0304818 A1   Oct. 3, 2019

(30) Foreign Application Priority Data
Mar. 30, 2018   (KR) .................. 10-2018-0036964

(51) Int. Cl.
| | |
|---|---|
| *H01L 21/67* | (2006.01) |
| *B65G 47/91* | (2006.01) |
| *H01L 33/62* | (2010.01) |
| *H01L 27/12* | (2006.01) |
| *H01L 25/075* | (2006.01) |

(52) U.S. Cl.
CPC ........ H01L 21/67144 (2013.01); B65G 47/91 (2013.01); *H01L 25/0753* (2013.01); *H01L 27/1214* (2013.01); *H01L 33/62* (2013.01)

(58) Field of Classification Search
CPC ... B65G 47/91; B65G 47/92; H01L 21/67144; H01L 24/95; H01L 24/75; H01L 2224/95145; H01L 2224/75745; H01L 2224/75724; H01L 25/167; H01L 21/6838; H01L 21/6831; Y10T 29/4913; Y10T 29/49149; Y10T 29/53174; Y10T 29/53191; Y10T 29/59196
USPC .......................................... 29/832, 833, 840
See application file for complete search history.

(56) References Cited

U.S. PATENT DOCUMENTS

| | | | | |
|---|---|---|---|---|
| 4,049,484 | A | * | 9/1977 | Priest ........................ B44C 1/16 156/285 |
| 5,792,304 | A | * | 8/1998 | Tamura ............. H01L 21/67109 156/345.27 |
| 6,991,703 | B2 | * | 1/2006 | Ootsuka .................. H01L 24/75 29/740 |
| 9,773,750 | B2 | * | 9/2017 | Bibl ........................ H01L 24/83 |

FOREIGN PATENT DOCUMENTS

| | | |
|---|---|---|
| KR | 100731673 B1 | 6/2007 |
| KR | 1020140112486 A | 9/2014 |
| KR | 1020170019415 A | 2/2017 |
| KR | 1020170024906 A | 3/2017 |
| KR | 1020170026959 A | 3/2017 |
| KR | 101754528 B1 | 6/2017 |
| KR | 101757404 B1 | 7/2017 |

* cited by examiner

*Primary Examiner* — Donghai D Nguyen

(57) ABSTRACT

The present invention relates to a system for transferring a micro LED, the system not only releasing a grip force of a transfer head when transferring a micro LED to a substrate but also applying an additional force to the micro LED from below the substrate to attract the micro LED onto the substrate.

18 Claims, 7 Drawing Sheets

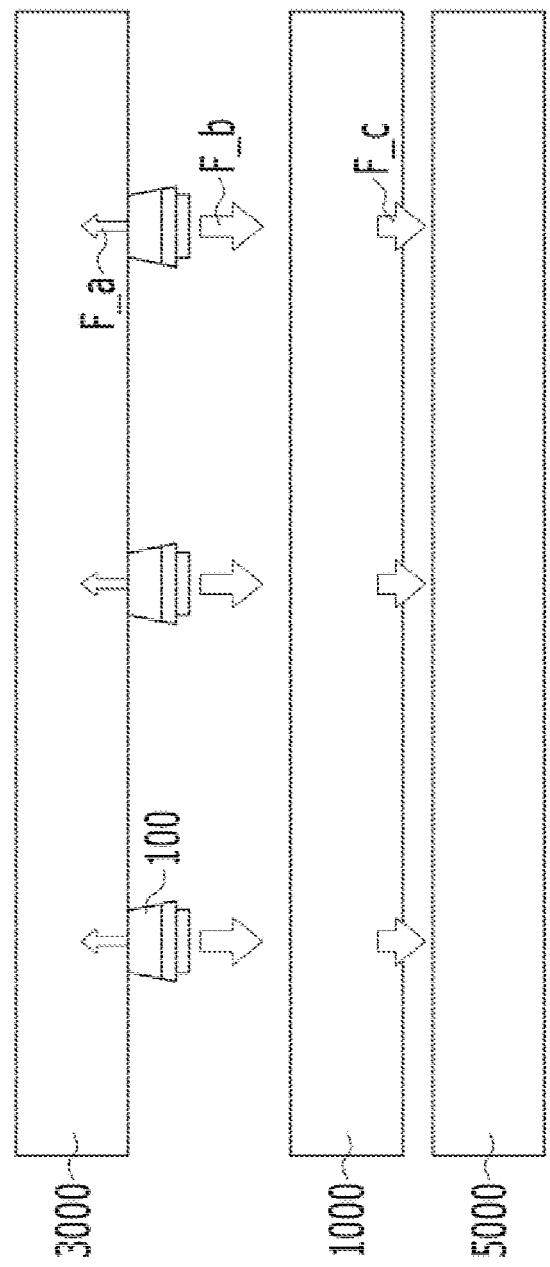

SYSTEM FOR TRANSFERRING MICRO LED

CROSS REFERENCE TO RELATED APPLICATION

The present application claims priority to Korean Patent Application No. 10-2018-0036964, filed Mar. 30, 2018, the entire contents of which is incorporated herein for all purposes by this reference.

BACKGROUND OF THE INVENTION

Field of the Invention

The present invention relates to a system for transferring a micro light-emitting diode (micro LED).

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next generation display. Liquid crystal and organic materials are the core materials of LCDs and OLEDs, respectively, whereas the micro LED display uses 1 μm to 100 μm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as ° Related Art 1') disclosed by Cree Inc., related research papers based thereon were subsequently published. In order to apply the micro LED to a display, it is necessary to develop a customized microchip based on a flexible material and/or flexible device using a micro LED device, and techniques of transferring the micrometer-sized LED chip and mounting the LED chip on a display pixel electrode are required.

Particularly, with regard to the transfer of the micro LED device to a circuit board, as the LED size is reduced to 1 μm to 100 μm, it is impossible to use a conventional pick-and-place machine, and a technology of a transfer head for higher precision is required. With respect to such technology of a transfer head, Luxvue Technology Corp., USA, proposed a method of transferring a micro LED using an electrostatic head (Korean Patent Application Publication No. 10-2014-0112486, hereinafter referred to as 'RelatedArt2'). X-Celeprint Limited, USA, proposed a method of using an elastic polymer material as a transfer head and transferring a micro LED positioned to a wafer to a desired substrate (Korean Patent Application Publication No. 10-2017-0019415, hereinafter referred to as 'Related Art 3'). Korea Photonics Technology Institute proposed a method of transferring a micro LED using a ciliary adhesive-structured head (Korean Patent No. 10-1754528, hereinafter referred to as 'Related Art 4'). Korea Institute of Machinery and Materials has proposed a method of transferring a micro LED using a roller coated with an adhesive (Korean Patent No. 10-1757404, hereinafter referred to as 'Related Art 5'). Samsung Display Co., Ltd proposed a method of transferring a micro-LED to an array substrate according to electrostatic induction by applying a negative voltage to first and second electrodes of the array substrate in a state where the array substrate is immersed in a solution (Korean Patent Application. Publication No. 10-2017-0026959, hereinafter referred to as 'Related Art 6'). LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7').

However, the above-mentioned related arts adopt a method in which micro LEDs are transferred depending on only the interaction between the transfer head, the micro LEDs, and the substrate. However, according to these related arts, when attaching the micro LEDs to the substrate, the micro LEDs are not held at predetermined positions but tilted while the micro LEDs are firmly attached to a bonding layer on the substrate.

DOCUMENTS OF RELATED ART (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906

SUMMARY OF THE INVENTION

Accordingly, the present invention has been made keeping in mind the above problems occurring in the related art, and an objective of the present invention is to provide a system for transferring a micro LED, the system not only releasing a grip force of a transfer head when transferring a micro LED to a substrate but also applying an additional force to the micro LED using a chuck provided below the substrate to attract the micro LED onto the substrate.

In order to achieve the above objective, there is provided a system for transferring a micro LED, the system including: a substrate; a transfer head transferring a micro LED to the substrate; and an electrostatic chuck provided below the substrate.

The electrostatic chuck may hold the substrate with an electrostatic force and apply the electrostatic force to the micro LED gripped by the transfer head to drop the micro LED onto the substrate.

The electrostatic chuck may be configured as an electrostatic chuck with low resistivity which uses the Johnsen-Rahbek effect.

The transfer head may include a porous member having pores and transfer the micro LED by applying a vacuum to the pores or releasing the applied vacuum.

The porous member may include an anodic oxide film formed by anodizing a metal.

The porous member may include a first porous member and a second porous member, wherein the first porous member vacuum-sucks the micro LED, and the second porous member is disposed between a vacuum chamber and the first porous member to transfer vacuum pressure of the vacuum chamber to the first porous member.

The substrate may be provided with a bonding pad at a position where the micro LED is attached.

The bonding pad may be configured as a metal layer.

The bonding pad may be configured as a non-metal layer.

The substrate may be configured as a circuit board.

In order to achieve the above objective, there is provided a system for transferring a micro LED, the system performing: attaching a substrate to an electrostatic chuck using an electrostatic force of the electrostatic chuck that is provided below the substrate; moving a transfer head that grips a micro LED above the substrate while the transfer head is spaced apart from the substrate; applying the electrostatic force of the electrostatic chuck to the micro LED gripped by the transfer head in order to drop the micro LED onto the substrate; and maintaining the electrostatic force of the electrostatic chuck while the micro LED transferred to the substrate is attached to the substrate.

In order to achieve the above objective, there is provided a system for transferring a micro LED, the system including: a transfer head transferring a micro LED; a substrate to which the micro LED is transferred by the transfer head; and an electrostatic chuck provided individually from the substrate to apply an electrostatic force to the micro LED.

In order to achieve the above objective, there is provided a system for transferring a micro LED, the system including: a transfer head transferring a micro LED; a substrate to which the micro LED is transferred by the transfer head; and a magnetic chuck provided individually from the substrate and provided below the substrate to apply a magnetic force to the micro LED.

Accordingly, the present invention has been made keeping in mind the above problems occurring in the related art, and an objective of the present invention is to provide a system for transferring a micro LED, the system not only releasing a grip force of a transfer head when transferring a micro LED to a substrate but also applying an additional force to the micro LED using a chuck provided below the substrate to attract the micro LED onto the substrate.

BRIEF DESCRIPTION OF THE DRAWINGS

The above and other objects, features and other advantages of the present invention will be more clearly understood from the following detailed description when taken in conjunction with the accompanying drawings, in which:

FIG. 7 is a view illustrating a system for transferring a micro LED according to an embodiment of the present invention.

DETAILED DESCRIPTION OF THE INVENTION

Figure 1:
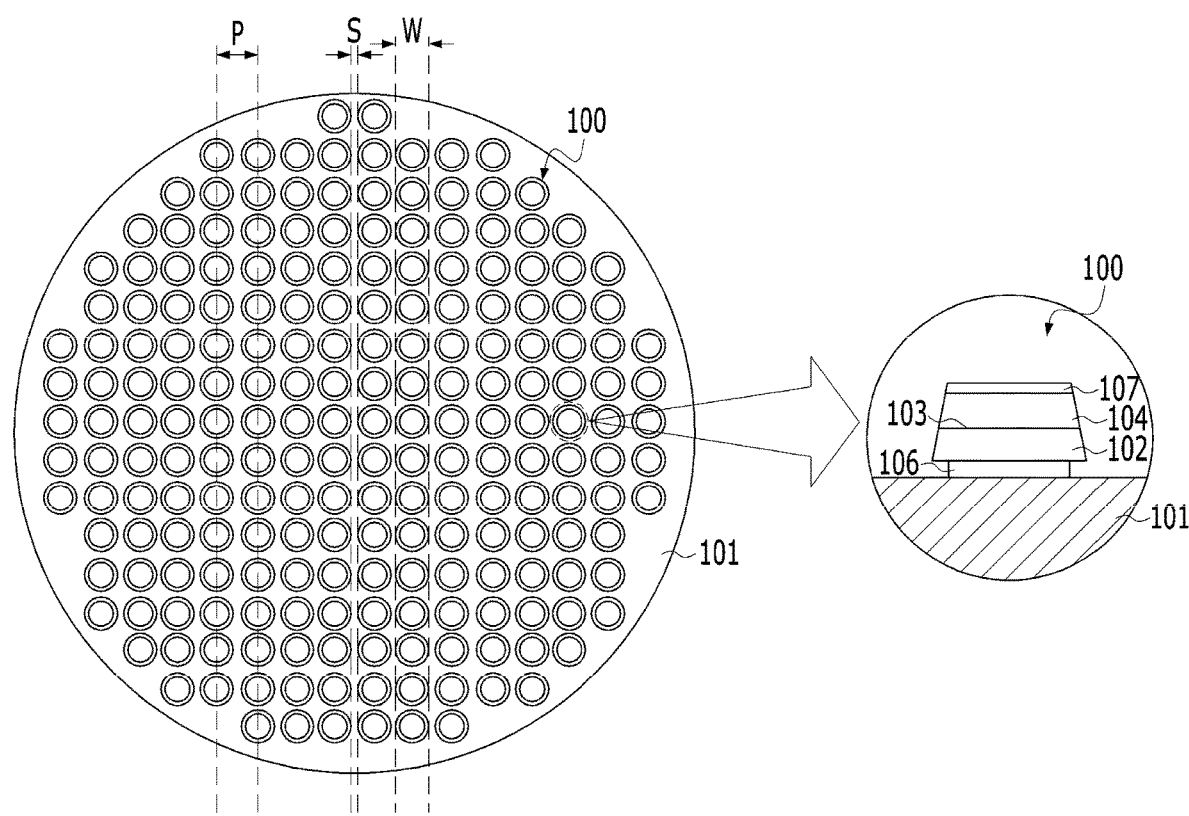
FIG. 1 is a view illustrating micro LEDs are fabricated on a growth substrate, the micro LEDs being objects to be transferred by a system for transferring a micro LED according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts In addition, the configuration and operation already described in other embodiments will be omitted for convenience.

A system for transferring a micro LED according to an embodiment of the present invention includes: a substrate; a transfer head transferring micro LEDs to the substrate; and an electrostatic chuck provided at a lower portion of the substrate. The electrostatic chuck holds the substrate with an electrostatic force and applies the electrostatic force to micro LEDs gripped by the transfer head to drop the micro LEDs onto the substrate.

The transfer head is provided to grip and transfer the micro LEDs. The grip force by which the transfer head grips the micro LEDs may be an electrostatic force, an electro-magnetic force, a magnetic force, a suction force, a van der Waals force, or a bonding force capable of losing the bonding force by heat or light, but is not limited thereto.

The substrate is provided to receive the micro LEDs from the transfer head. A bonding pad to which the micro LEDs are attached is provided on an upper surface of the substrate. The bonding pad may be configured into of a metal layer or a non-metal layer. In addition, the substrate may be embodied by a circuit board on which the micro LEDs are ultimately mounted.

In addition, a system for transferring a micro LED according to an embodiment of the present invention includes: a transfer head transferring micro LEDs; a substrate to which the micro LEDs are transferred by the transfer head; and a magnetic chuck provided individually from the substrate and provided at a lower portion of the substrate to apply a magnetic force to the micro LEDs.

In addition, a system for transferring a micro LED according to an embodiment of the present invention includes: a transfer head transferring micro LEDs with a first physical force; a substrate to which the micro LEDs are transferred by the transfer head; and a chuck applying a second physical force to the micro LEDs gripped by the transfer head.

Unlike the related art in which micro LEDs are transferred only depending on the interaction between a transfer head, the micro LEDs, and a substrate, the system for transferring a micro LED according to the embodiment of the present invention is configured such that an additional force is provided to transfer the micro LEDs to the substrate. Thus, it is possible to prevent the micro LEDs from being tilted while the micro LEDs are attached to the substrate.

Hereinafter, embodiments of the present invention will be described in detail with reference to the accompanying drawings. Micro LEDs 100, which are objects to be transferred by a transfer system of the present invention, will be described with reference to FIG. 1.

FIG. 1 is a view illustrating the multiple micro LEDs 100 which are objects to be transferred by a transfer head.

The micro LEDs 100 are fabricated and disposed on a growth substrate 101. The growth substrate 101 may be formed into a conductive substrate or an insulating substrate. For example, the growth substrate 101 is made of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba.

The second semiconductor layer 104 may be implemented, for example, as an n-type semiconductor layer. An n-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may include an n-type semiconductor layer, and the second semiconductor layer 104 may include a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107.

The first contact electrode 106 and/or the second contact electrode 107 may include one or more layers and may be made of various conductive materials including a metal, conductive oxide, and conductive polymer.

The multiple micro LEDs 100 formed on the growth substrate 101 are separated into individual pieces by etching. Then, it is possible to separate the individual pieces of the micro LEDs 100 from the growth substrate 101 by a laser lift-off process.

In FIG. 1, the letter 'P' denotes a pitch distance between the micro LEDs 100, 'S' denotes a separation distance between the micro LEDs 100, and °W° denotes a width of each micro LEDs 100.

The micro LEDs 100 which are separable from the growth substrate 101 are transferred by the transfer head. The transfer head is provided to grip and transfer the micro LEDs 100. The grip force by which the transfer head grips the micro LEDs 100 may be an electrostatic force, a magnetic force, a suction force, a van der Waals force, or a bonding force capable of losing the bonding force by heat or light, but is not limited thereto.

The following description will be based on an embodiment in which a grip force gripping the micro LEDs 100 is configured to be a suction force. Thus, the transfer head may include a porous member having pores and may be configured to apply vacuum to the pores of the porous member and release the vacuum applied to the pores in order to transfer the micro LEDs 100 to a substrate.

The porous member is provided with a vacuum chamber at an upper portion thereof. The vacuum chamber is connected to a vacuum port providing vacuum or releasing the vacuum. The vacuum chamber functions to vacuum the multiple pores of the porous member or release the vacuum applied to the pores according to the operation of the vacuum port. A structure of engaging the vacuum chamber to the porous member is not limited as long as the structure is suitable for preventing gas or air from leaking to other parts when applying the vacuum to the porous member or releasing the applied vacuum.

When gripping the micro LEDs with vacuum-suction, the vacuum applied to the vacuum chamber is transferred to the multiple pores of the porous member to generate a vacuum suction force for the micro LEDs 100. When detaching the micro LED 100, the vacuum applied to the vacuum chamber is released to remove the vacuum from the multiple pores of the porous member whereby the vacuum suction force to the micro LED 100 is removed.

The porous member may be composed of a material containing a large number of pores therein, and may be configured as powders, a thin film, a thick film, or a bulk form having a porosity of about 0.2 to 0.95 in a predetermined arrangement or disordered pore structure. The pores of the porous member are classified according to pore sizes thereof: micropores having a pore diameter of 2 nm or less, mesopores having a pore diameter of 2 nm to 50 nm, and macropores having a pore diameter of 50 nm or more. The porous member 1100 may include at least some of micropores, mesopores, and macropores. Porous materials of the porous member are classified according to constituent components thereof: organic, inorganic (ceramic), metal, and hybrid type. The porous member includes an anodic oxide film in which pores are formed in a predetermined arrangement. The porous member is configured as powders, a coating film, or bulk form. The powder may have various shapes such as a sphere, a hollow sphere, a fiber, and a tube. The powder may be used as it is in some cases, but it is also possible to prepare a coating film or a bulk form with the powder as a starting material.

When the pores of the porous member have a disordered pore structure, the multiple pores are connected to each other inside the porous member such that air flow paths are formed which connects upper and lower portions of the porous member. When the pores of the porous member have a vertical pore structure, the inside of the porous member is pierced from top to bottom by the vertical pores such that air flow paths are formed.

The porous member includes a suction region gripping the micro LEDs and a non-suction region not gripping the micro LEDs 100. The suction region is a region where vacuum of the vacuum chamber is transferred and grips the micro LEDs by vacuum-suction. The non-suction region is a region where vacuum of the vacuum chamber is not transferred and thus does not grip the micro LEDs 100.

The non-suction region may be embodied by forming a shielding portion on at least a part of a surface of the porous member. The shielding portion is formed to close the pores exposed at least a part of a surface of the porous member. The shielding portion may be formed on at least a part of upper and lower surfaces of the porous member. In particular, in the case where the porous member has a disordered pore structure, the shielding portion may be formed on both the upper and lower surfaces of the porous member.

The shielding portion is not limited in material, shape, and thickness as long as the shielding portion functions to close the pores exposed to the surface of the porous member. Preferably, the shielding portion may be further provided and made of a photoresist (PR, including dry film PR) or a metal or may be provided by the own structure of the porous member. In the case the shielding portion is provided by the structure of the porous member, for example, in the case the porous member to be described later is made of an anodic oxide film, the shielding portion may be a barrier layer or a metal base material.

A size of a horizontal area of each suction region may be smaller than a size of a horizontal area of an upper surface of each micro LED 100 to prevent vacuum leakage while the micro LED 100 is gripped by vacuum-suction, whereby it is possible to perform vacuum-suction easily.

Figure 2:
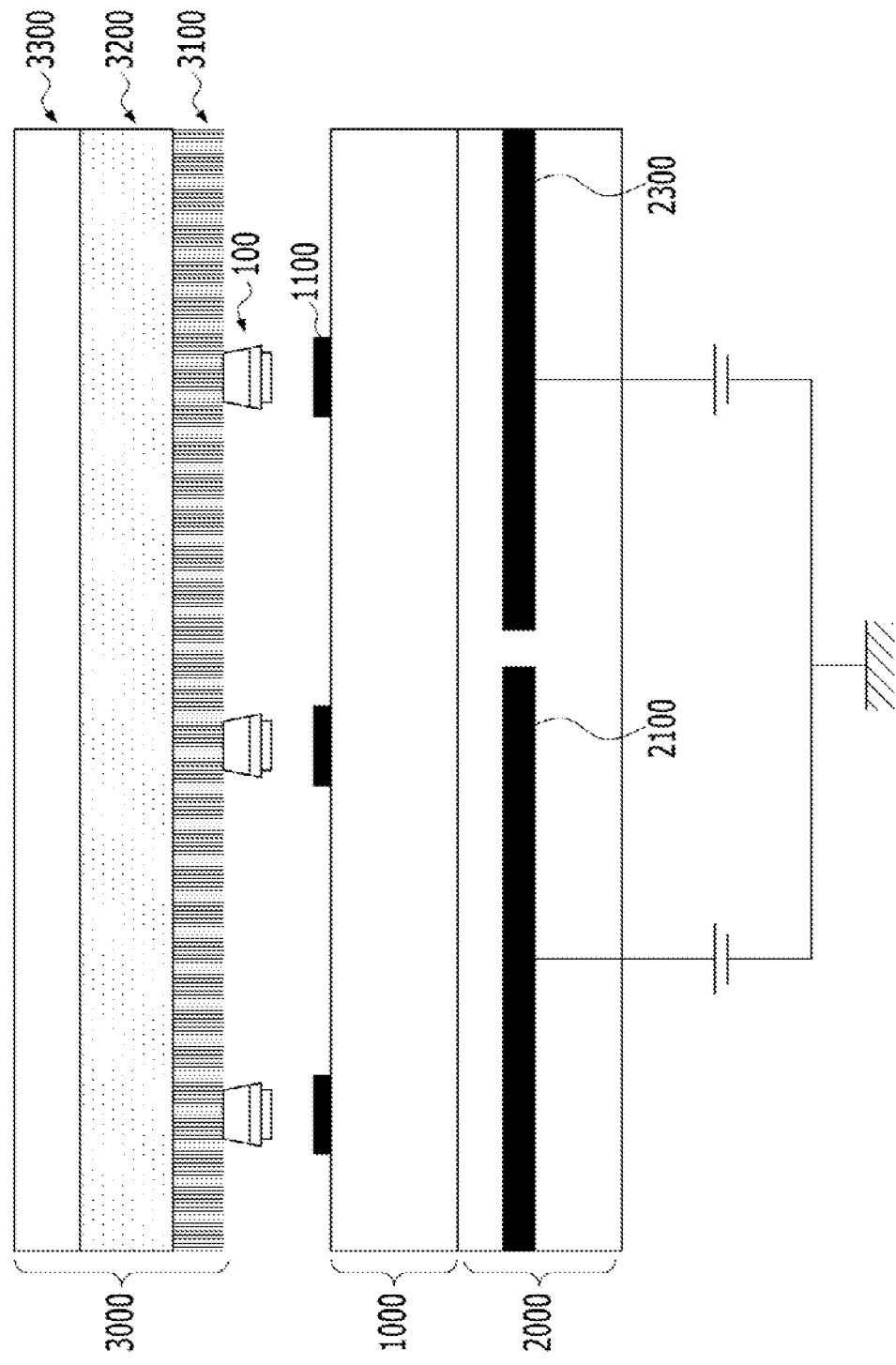
FIG. 2 is a view illustrating a system for transferring a micro LED according to an embodiment of the present invention.

A transfer head 3000 illustrated in FIG. 2 is an embodiment of the transfer head having the above-described porous member and includes a first porous member 3100 and a second porous member 3200.

The first porous member 3100 vacuum-sucks the micro LEDs 100 directly, and the second porous member 3200 is provided on the first porous member 3100 to support the first porous member 3100 at the top of the first porous member 3100. A vacuum chamber 3300 is provided on the second porous member 3200, and a suction force is imparted to the first porous member 3100 by the vacuum chamber 3300.

The first porous member 3100 is embodied by an anodic oxide film having pores formed by anodizing a metal. The anodic oxide film is a film formed by anodizing a metal that is a base material, and the pores are formed in a process of forming the anodic oxide film by anodizing the metal. For example, in a case that the base metal is aluminum (Al) or an aluminum alloy, the anodization of the base material forms the anodic oxide film consisting of anodized aluminum ($Al_2O_3$) on a surface of the base material. The anodic oxide film formed as described above includes a barrier layer in which pores are not formed and a porous layer in which the pores are formed inside. The barrier layer is positioned on top of the base material and the porous layer is positioned on top of the barrier layer. After removing the base material on which the anodic oxide film having the barrier layer and the porous layer is formed, only anodic oxide film consisting of anodized aluminum ($Al_2O_3$) remains. The anodic oxide film has the pores configured vertically and having a regular arrangement with a uniform diameter. Accordingly, after removing the barrier layer, the pores have a structure extending from top to bottom vertically, thereby facilitating the generation of the vacuum pressure in the vertical direction.

The inside of the anodic oxide film forms an air flow path vertically by the vertical pores. An internal width of the pores has a size of several nanometers to several hundred nanometers. For example, when a size of the micro LED to be vacuum-sucked is 30 μm×30 μm and an internal width of the pores is several nanometers, it is possible to vacuum-suck the micro LED 100 by approximately tens of millions of pores. When a size of the micro LED to be vacuum-sucked is 30 μm×30 μm and an internal width of the pores is several hundred nanometers, it is possible to vacuum-suck the micro LEDs 100 by approximately tens of thousands of pores. The micro LED 100 is lightweight because the micro LED 100 is fundamentally configured with the first semiconductor layer 102, the second semiconductor layer 104, the active layer 103 provided between the first semiconductor layer 102 and the second semiconductor layer 104, the first contact electrode 106, and the second contact electrode 107. Accordingly, it is possible to grip the micro LEDs 100 by tens of thousands to tens of millions of pores formed in the anodic oxide film by vacuum-suction.

The anodic oxide film 1300 includes a suction region gripping the micro LEDs 100 by vacuum-suction and a non-suction region not gripping the micro LEDs 100. The suction region is a region where vacuum of the vacuum chamber 3300 is transferred and grips the micro LEDs 100 by vacuum-suction. The non-suction region is a region where vacuum of the vacuum chamber 3300 is not transferred and thus does not grip the micro LEDs 100. Preferably, the suction region is a region where the pores extend from top to bottom vertically, and the non-suction region is a region where at least any one of upper and lower portions of the pores is closed.

The second porous member 3200 is provided on the first porous member 3100. The second porous member 3200 may be composed of a porous scaffold functioning to support the first porous member 3100. A material of the second porous member 3200 is not limited as long as the second porous member 3200 made of the material functions to support the first porous member 3100. The second porous member 3200 may have the above-mentioned configuration of the porous member. For example, the second porous member 3200 may be made of a porous ceramic material.

The vacuum chamber 3300 is connected to a vacuum port providing vacuum pressure. The vacuum chamber 3300 functions to vacuum the multiple vertical pores of the first porous member 3100 or release the vacuum according to the operation of the vacuum port.

When gripping the micro LEDs 100, the vacuum applied to the vacuum chamber 3300 is transferred to the multiple pores of the first porous member 3100 to provide a vacuum suction force for the micro LEDs 100. When detaching the micro LEDs 100, the vacuum applied to the vacuum chamber 3300 is released to remove the vacuum from the multiple pores of the first porous member 3100 whereby the vacuum suction force to the micro LEDs 100 is removed.

As described above, the transfer head according to the embodiment of the present invention includes the porous members, and the transfer head sucks the micro LEDs 100 with the suction force as a grip force and transfers the micro LEDs 100 to a substrate 1000.

The substrate 1000 is provided to receive the micro LEDs 100 from the transfer head 3000. A bonding pad 1100 to which the micro LEDs 100 are attached is provided on an upper surface of the substrate 1100. The bonding pad 1100 may be configured into a metal layer or a non-metal layer.

The bonding pad 1100 is provided on the upper surface of the substrate 1000. The bonding pad 1100 receives the micro LEDs 100 from the transfer head 3000 and holds the micro LEDs 100 on the substrate 1000. The bonding pad 1100 may be formed in an island layout at a position corresponding to the micro LEDs 100 or may be formed on the entire upper surface of the substrate 1000.

Figure 4:
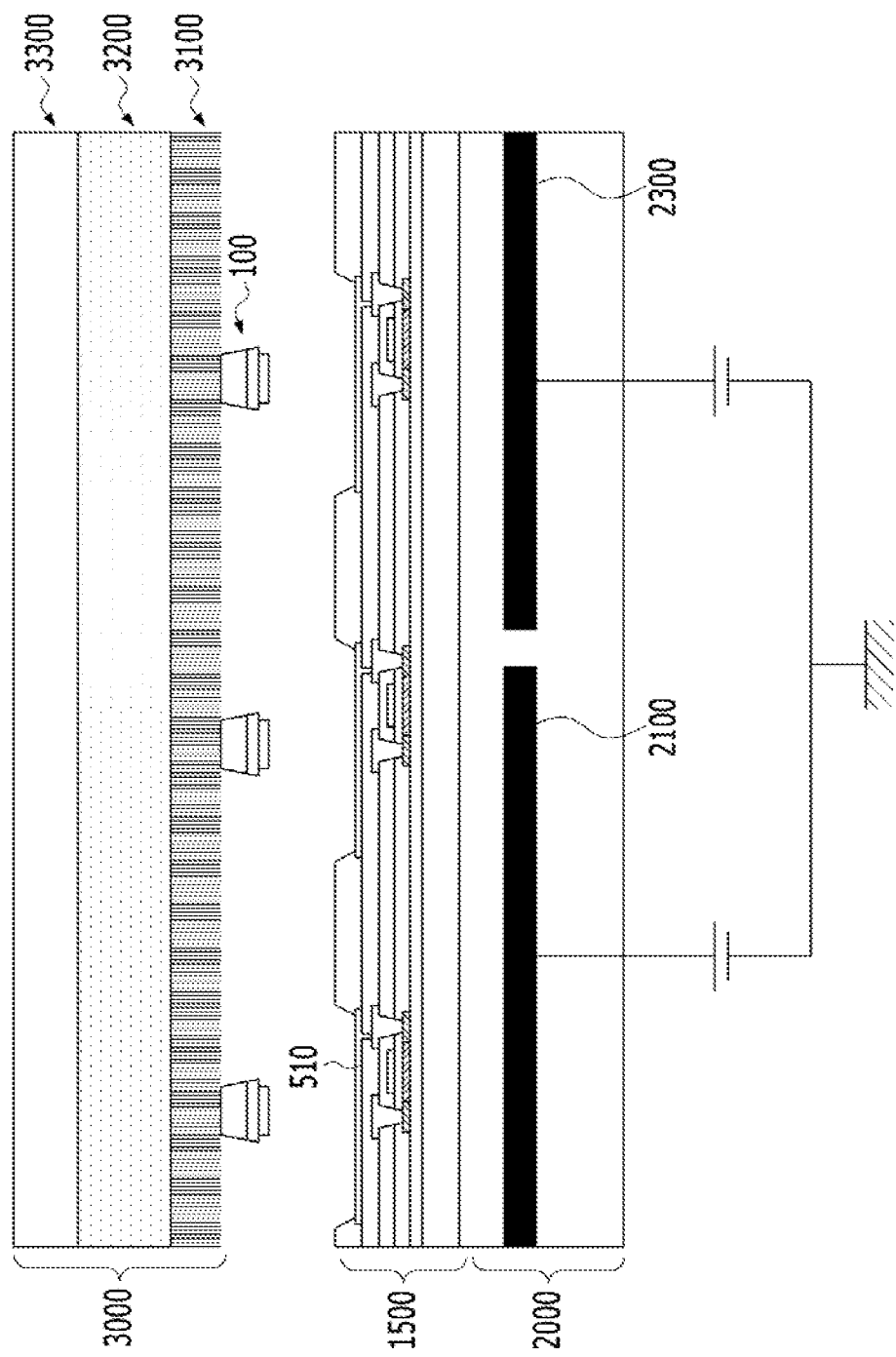
FIG. 4 is a view illustrating a system for transferring a micro LED according to an embodiment of the present invention.

The bonding pad 1100 may be configured into a metal layer. In the case the bonding pad 1100 is configured into a metal layer, the bonding pad 1100 may be electrically connected to a contact electrode provided under the micro LED 100. In addition, in the case the substrate 1000 is embodied by a circuit board 1500, the bonding pad 1100 may include an electrode as illustrated in FIG. 4. In addition, as the bonding pad 1100 is configured into a metal layer, the micro LEDs 100 may be bonded on the substrate 1000 eutectically.

Alternatively, the bonding pad 1100 may be configured into a non-metal layer. In the case the bonding pad 1100 is configured into a non-metal layer, the substrate 1000 is not a circuit board on which the micro LEDs 100 are mounted ultimately, but rather a temporary substrate on which the micro LEDs 100 are in a mesial state for transferring the micro LEDs 100 to the circuit board.

An electrostatic chuck 2000 is provided below the substrate 1000. The electrostatic chuck 2000 is manufactured individually from the substrate 1000 and provided below the substrate 1000 in close contact therewith. The electrostatic chuck 2000 holds the substrate 1000 thereon with an electrostatic force.

Electrodes 2100 and 2300 are provided inside the electrostatic chuck 2000 such that it is possible to apply a voltage to the electrodes to induce the electrostatic force.

The electrostatic chuck 2000 is classified into an electrostatic chuck with low resistivity and an electrostatic chuck with high resistivity according to a resistivity value of a dielectric material. However, the electrostatic chuck 2000 suitable for the embodiment of the present invention is not limited thereto. The electrostatic chuck 2000 according to the embodiment of the present invention not only holds the substrate 1000 on the electrostatic chuck 2000 but also applies the electrostatic force to the micro LEDs 100. Thus, it is preferable to use an electrostatic chuck with low resistivity which uses the Johnsen-Rahbek effect in which a large electrostatic force is induced. 1*n* the case of an electrostatic chuck with high resistivity, charges corresponding to an applied voltage are accumulated, and a coulomb force acts between positive and negative charges. Conversely, in the case of an electrostatic chuck with low resistivity, in addition to the charge accumulation by the applied voltage, the accumulation of charges moved to an interface between an insulating layer of a lower portion of the substrate 1000 and an upper portion of the electrostatic chuck 2000 by leakage current yields a force. Since the electrostatic force between the charges induced at the interface has short distance, the electrostatic chuck with low resistivity which uses the Johnsen-Rahbek effect has a greater electrostatic force than the electrostatic chuck with high resistivity.

A method of transferring the micro LEDs 100 will be described with reference to FIGS. 2 and 3. The method includes: attaching the substrate 1000 to the electrostatic chuck 2000 using the electrostatic force of the electrostatic chuck 2000 provided below the substrate 1000; moving the transfer head 3000 gripping the micro LEDs 100 above the substrate 1000 while being spaced apart from the substrate 1000; applying the electrostatic force of the electrostatic chuck 2000 to the micro LEDs 100 gripped by the transfer head 3000 to drop the micro LEDs 100 onto the substrate 1000; maintaining the electrostatic force of the electrostatic chuck 2000 while the micro LEDs 100 transferred to the substrate 1000 is attached to the substrate 1000; and removing the electrostatic chuck 2000 from the substrate 1000 after the micro LEDs 100 are attached to the substrate 1000.

When a voltage is applied to the electrostatic chuck 2000, the electrostatic chuck 2000 holds the substrate 1000 on an upper surface of the electrostatic chuck 2000 using an electrostatic force. The electrostatic force generated in the electrostatic chuck 2000 also acts on the micro LEDs 100 gripped by the transfer head 3000. When the electrostatic force acting on the micro LEDs 100 is greater than the force gripping the micro LEDs 100 by the transfer head 3000, the micro LEDs 100 are dropped toward the substrate 1000 due to the difference between the two forces. Thus, it is possible to transfer the micro LEDs 100 to the substrate 1000 in a state where the micro LEDs 100 are spaced apart from the substrate 1000.

Figure 3:
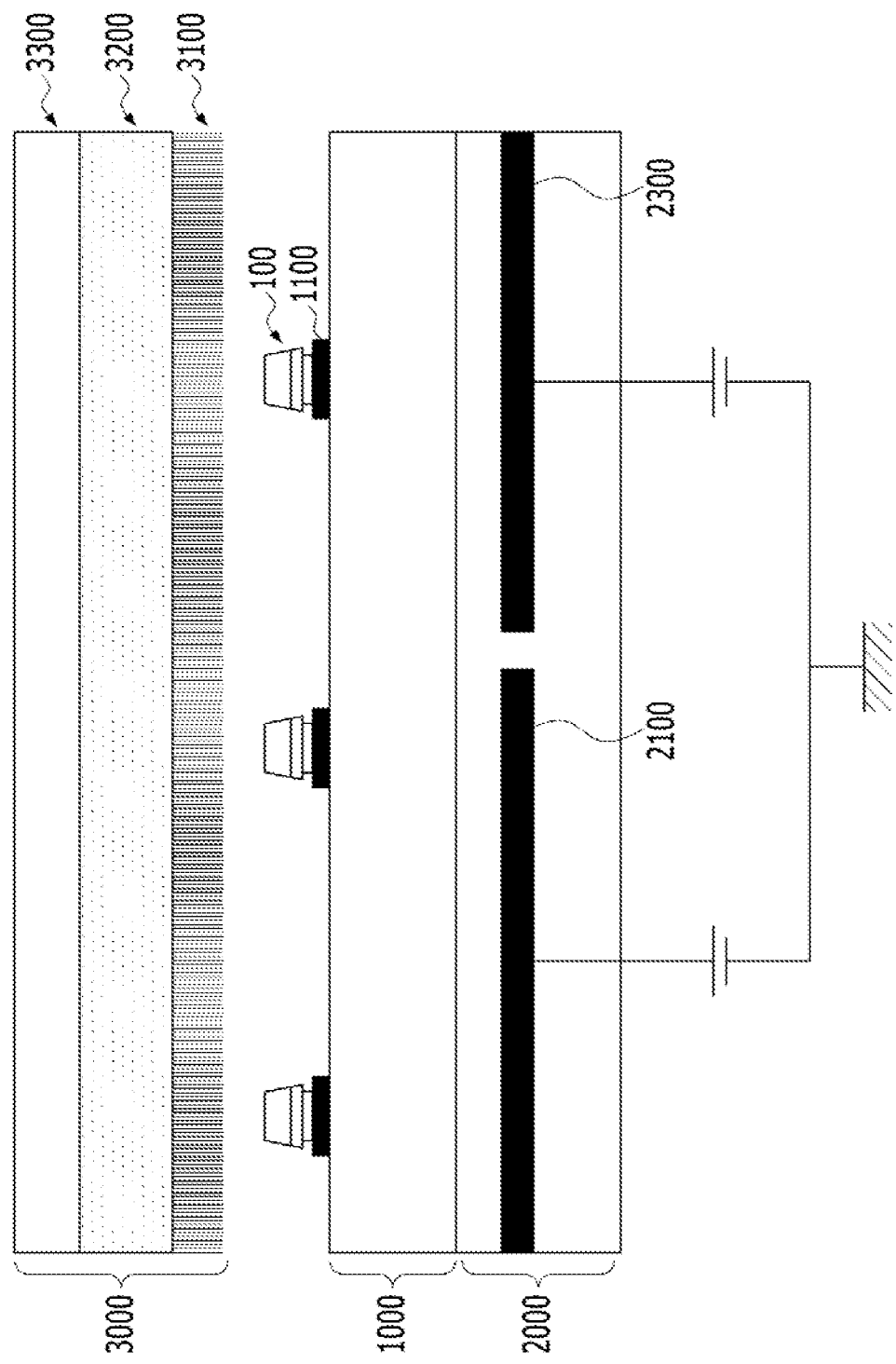
FIG. 3 is a view illustrating; a micro LED illustrated in FIG. 2 is transferred to a substrate.

As illustrated in FIG. 3, the electrostatic force generated by the operation of the electrostatic chuck 2000 attracts the micro LEDs 100 downward even after the micro LEDs 100 are transferred to the substrate 1000. Accordingly, it is possible to securely hold the micro LEDs 100 on the bonding pad 1100 of the substrate 1000 because the micro LEDs 100 receive the downward force continuously even after transferred to the substrate 1000. In addition, it is possible to prevent the micro LEDs 100 from being tilted during the process of attaching the micro LEDs 100 to the bonding pad 1100, thereby preventing misalignment of the micro LEDs 100.

Figure 5:
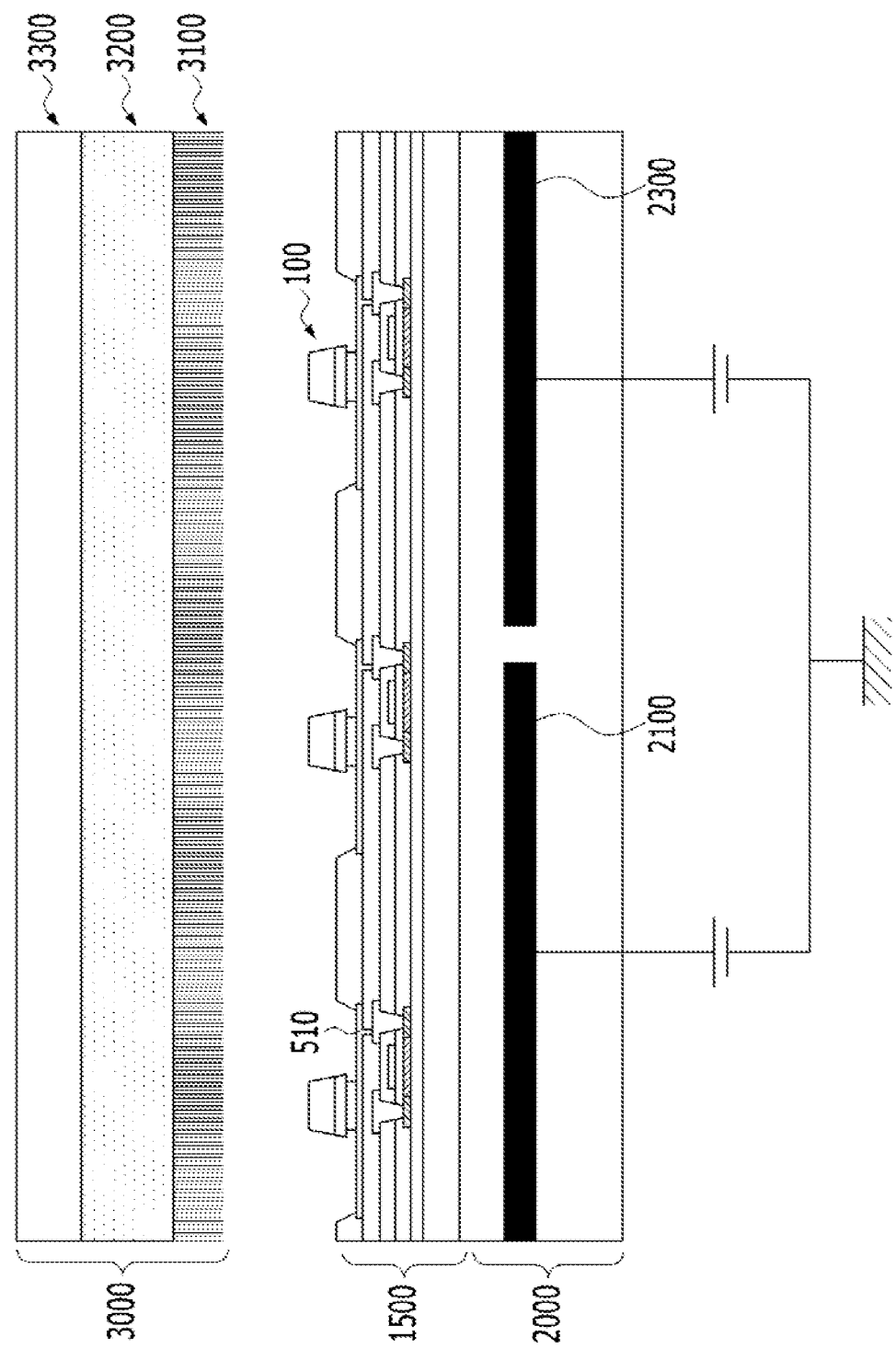
FIG. 5 is a view illustrating the micro LED illustrated in FIG. 4 is transferred to a substrate.

FIGS. 4 and 5 are views illustrating the substrate 1000 of FIGS. 2 and 3 is embodied by the circuit board 1500. A transfer system according to an embodiment of the present invention illustrated in FIGS. 4 and 5 differs from the system illustrated in FIGS. 2 and 3 in that the substrate 1000 in FIGS. 2 and 3 is configured as the circuit board 1500 in FIGS. 4 and 5, but the other components are the same.

According to the embodiment illustrated in FIGS. 4 and 5, the micro LEDs 100 are transferred to above the circuit board 1500 by the transfer head 3000. At this point, a voltage is applied to the electrostatic chuck 2000 provided below the circuit board 1500 to hold the circuit board 1500 on the upper surface of the electrostatic chuck 2000 with the electrostatic force. The electrostatic force also acts between the electrostatic chuck 2000 and the micro LEDs 100 so that the micro LEDs 100 gripped by the transfer head 3000 receive the downward force dropping the micro LEDs 100 toward the circuit board 1500.

When the electrostatic force acting on the micro LEDs 100 is greater than the force gripping the micro LEDs 100 by the transfer head 3000, the micro LEDs 100 are dropped toward the circuit board 1500 due to the difference between the two forces. Thus, it is possible to transfer the micro LEDs 100 to the circuit board 1500 in a state where the micro LEDs 100 are spaced apart from the circuit board 1500.

As illustrated in FIG. 5, the electrostatic force generated by the operation of the electrostatic chuck 2000 attracts the micro LEDs 100 downward even after the micro LEDs 100 are transferred to the circuit board 1500. Accordingly, it is possible to securely hold the micro LEDs 100 on a first electrode 510 of the circuit board 1500 because the micro LEDs 100 receive the downward force continuously even after transferred to the circuit board 1500. In addition, it is possible to prevent the micro LEDs 100 from being tilted during the process of attaching the micro LEDs 100 to the first electrode 510, thereby preventing misalignment of the micro LEDs 100.

When the micro LEDs 100 are transferred to the circuit board 1500 and the attachment with the first electrode 510 is completed, the operation of the electrostatic chuck 2000 is stopped to remove the electrostatic force. As a result, the circuit board 1500 becomes detachable from the electrostatic chuck 2000. Then, the circuit board 1500 on which the micro LEDs 100 are mounted is transferred for subsequent processing, and then completed as a structure illustrated in FIG. 6.

Figure 6:
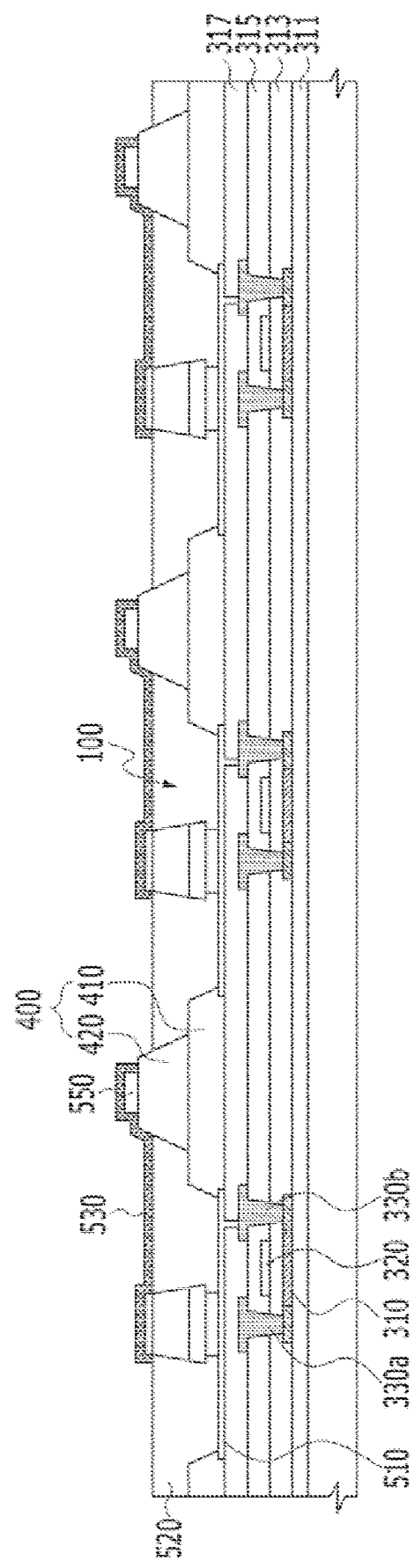
FIG. 6 is a view illustrating a micro LED structure fabricated based on a structure illustrated in FIG. 5.

FIG. 6 is a view illustrating a micro LED structure formed by transferring and mounting the micro LEDs 100 on the circuit board 1500 using the transfer head 3000.

The circuit board 1500 may include various materials. For example, the circuit board 1500 may be made of a transparent glass material having $SiO_2$ as a main component. However, materials of the circuit board 1500 are not limited to this, and the circuit board 1500 may be made of a transparent plastic material and have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the circuit board 1500, the circuit board 1500 is required to be made of a transparent material. However, in the case of a top emission type in which an image is implemented in a direction opposite to the circuit board 1500, the circuit board 1500 is not required to be made of a transparent material. In this case, the circuit board 1500 may be made of metal.

In the case of forming the circuit board 1500 using metal, the circuit board 1500 may be made of at least one metal selected from among the group consisting of iron, chromium, manganese, nickel, titanium, molybdenum, stainless steel (SUS), Invar, Inconel, and Kovar, but is not limited thereto.

The circuit board 1500 may include a buffer layer 311. The buffer layer 311 provides a flat surface and blocks foreign matter or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT. The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni) neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a and the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$) tantalum pentoxide ($Ta_2O_5$), hafnium dioxide ($HfO_2$) or zirconium dioxide ($ZrO_2$).

The source electrode 330a and the drain electrode 330b are provided on the interlayer dielectric film 315. The source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides, poly (aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where the micro LED 100 will be received. The bank layer 400 may include, for example, a first bank layer 410 defining the recess. A height of the first bank layer 410 may be determined by a height and viewing angle of the micro LED 100. A size (width) of the recess may be determined by resolution, pixel density, and the like, of a display device In an embodiment, the height of the micro LED 100 may be greater than the height of the first bank layer 410. The recess may have a quadrangular cross section, but is not limited to this. The recess may have various cross section shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire substrate such that the second electrode 530 serves as a shared electrode that pixels (P) share. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be formed of a thermoplastic such as polycarbonate (PC), polyethylene terephthalate (PET), polyethersulfone, polyvinyl butyral, polyphenylene ether, polyamide, polyetherimide, polynorbornene, poly (methyl methacrylate) resin, and cyclic polyolefin resin, a thermosetting plastic such as epoxy resin, phenolic resin, urethane resin, acrylic resin, vinyl ester resin, polyimide resin, urea resin, and melamine resin, or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto In an embodiment, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride), or the like. In an alternate embodiment, the first bank layer 410 and the second bank layer 420 may be a distributed Bragg reflector (DBR) having high reflectivity or a mirror reflector made of metal.

The micro LED 100 is disposed in the recess. The micro LED 100 may be electrically connected to the first electrode 510 at the recess.

The micro LED 100 emits light having wavelengths of different colors such as red, green, blue, white, and the like. With the micro LED 100, it is possible to realize white light by using fluorescent materials or by combining colors. The micro LED 100 has a size of 1 μm to 100 μm. The micro LEDs 100 are picked up from the growth substrate 101 individually or collectively by a transfer head according to the embodiment of the present invention, transferred to the circuit board 1500, and received in the recess of the circuit board 1500.

The micro LED 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be made of an organic insulating substance. For example, the passivation layer 520 may be made of acrylic, poly (methyl methacrylate) (PMMA), benzocyclobutene (BCE), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive material such as ITO, IZO, ZnO, and $In_2O_3$.

The above-described system for transferring a micro LED according to the embodiment of the present invention includes an electrostatic chuck. On the other hand, a system for transferring a micro LED according to another embodiment of the present invention includes: a transfer head transferring micro LEDs; a substrate to which the micro LEDs are transferred by the transfer head; and a magnetic chuck provided individually from the substrate and provided at a lower portion of the substrate to apply a magnetic force to the micro LEDs.

The magnetic chuck (not illustrated) functions to apply a magnetic force to the micro LEDs to transfer the micro LEDs to the substrate. In order to detach the micro LEDs from the transfer head, the magnetic chuck is required to apply a magnetic force greater than the force of the transfer head gripping the micro LEDs. In addition, a magnetic material is required to be further provided in the micro LEDs to generate attraction force corresponding to the magnetic force of the magnetic chuck.

Hereinbelow, a system for transferring a micro LED according to an embodiment of the present invention will be described with reference to FIG. 7. Referring to FIG. 7, a system for transferring a micro LED according to an embodiment of the present invention includes: a transfer head 3000 gripping micro LEDs 100 with a first physical force (F_a) to transfer the micro LEDs 100; a substrate 1000 to which the micro LEDs 100 are transferred by the transfer head 3000; and a chuck 5000 applying a second physical force (F_b) to the micro LEDs gripped by the transfer head 3000.

Here, the first physical force (F_a) is at least one of an electrostatic force, a magnetic force, and a suction force, and the second physical force (F_b) is at least one of an electrostatic force, a magnetic force, and a magnetic force.

The substrate 1000 is held onto the chuck 5000 by the same physical force as the second physical force (F_b). In other words, the force (F_b) that the chuck 5000 attracts the micro LEDs 100 and a force (F_c) that the chuck 5000 attracts the substrate 1000 are the same physical forces (Although FIG. 7 illustrates the substrate 1000 and the chuck 5000 are spaced apart from each other, this is for convenience of explanation that the substrate 1000 is attracted and held onto the chuck 5000 by the force (F_c) that the chuck 5000 attracts the substrate 1000. Accordingly, the substrate 1000 is tightly held in close contact with the chuck 5000 by the force (F_c) that the chuck 5000 attracts the substrate 1000). For example, in the case the chuck 5000 holds the substrate 1000 thereto by the electrostatic force, the chuck 5000 attracts the micro LEDs 100 toward the substrate 1000 by the electrostatic force. Here, the force (F_b) that the chuck 5000 attracts the micro LEDs 100 and the force (F_c) that chuck 5000 attracts the substrate 1000 are the electrostatic force and the same physical force. By using the same physical force, it is possible to hold the substrate 1000 onto the chuck 5000, to attract the micro LEDs 100 gripped by the transfer head 3000, and to transfer the micro LEDs 100 to the substrate 1000.

In the case the second physical force (F_b) is greater than the first physical force (F_a), the micro LEDs receive both the second physical force (F_b) and the first physical force (F_a) but are transferred to the substrate 1000 due to the difference between the two forces. Conversely, in the case the second physical force (F_b) is smaller than the first physical force (F_a), the micro LEDs receive both the second physical force (F_b) and the first physical force (F_a) but are kept being gripped by the transfer head 3000 due to the difference between the two forces.

The second physical force (F_b) may act on all of the micro LEDs 100 together which are gripped by the transfer head 3000. When the second physical force (F_b) is made greater than the first physical force (F_a) and acts on all of the micro LEDs 100 together which are gripped by the transfer head 3000, all of the micro LEDs 100 gripped by the transfer head 3000 are transferred to the substrate 1000 together.

The second physical force (F_c) may act on some of the micro LEDs 100 gripped by the transfer head 3000. When the second physical force (F_c) is made greater than the first physical force (F_a) and acts on some of the micro LEDs 100 gripped by the transfer head 3000, only the micro LED 100 that receives the second physical force of all the micro LEDs 100 gripped by the transfer head 3000 is transferred to the substrate 1000.

The second physical force (F_b) may be held while the micro LEDs 100 are transferred and attached to the substrate 1000. Thus, it is possible to prevent the micro LEDs 100 from being tilted while the micro LEDs 100 are attached to the substrate 1000.

Unlike the related art in which the micro LEDs are transferred only depending on the interaction between the transfer head, the micro LEDs, and the substrate, the system for transferring a micro LED according to the embodiment of the present invention is configured such that an additional force is provided to transfer the micro LEDs 100 to the substrate 1000 or to the substrate 1500. Thus, it is possible to transfer the micro LEDs 100 to the substrate 1000 or to the substrate 1500 easily. In addition, it is possible to prevent the micro LEDs 100 from being tilted while the micro LEDs are attached to the substrate 1000 or to the substrate 1500.

Unlike the related art in which an additional device is required to hold the substrate 1000 or the substrate 1500, the system according to the embodiment of the present invention is configured such that the chuck 2000 or the chuck 5000 holds the substrate 1000 or to the substrate 1500. In addition, the system according to the embodiment of the present invention is configured such that the same physical force used for holding the substrate 1000 or to the substrate 1500 is also used to transfer the micro LEDs 100 to the substrate 1000 or to the substrate 1500.

Unlike the related art in which the micro LEDs are transferred to the substrate by bringing the micro LEDs into contact with the upper surface of the substrate, the system according to the embodiment of the present invention is configured to transfer the micro LEDs to the substrate 1000 or to the substrate 1500 even when the micro LEDs 100 are spaced apart from an upper surface of the substrate 1000 or the substrate 1500. As a result, it is unnecessary to control the lowermost position of the transfer head 3000 with high precision. In addition, it is possible to prevent the micro LEDs 100 from colliding with the upper surface of the substrate 1000 or the substrate 1500, thereby preventing damage to the micro LEDs 100.

As described above, the present invention has been described with reference to the preferred embodiments. However, those skilled in the art will appreciate that various modifications, additions and substitutions are possible, without departing from the scope and spirit of the invention as disclosed in the accompanying claims.

The invention claimed is:

1. A system for transferring a micro LED, the system comprising:
    a substrate;
    a transfer head transferring a micro LED to the substrate; and
    an electrostatic chuck provided below the substrate,
    wherein the electrostatic chuck holds the substrate with an electrostatic force and applies the electrostatic force to the micro LED gripped by the transfer head to drop the micro LED onto the substrate.

2. The system of claim 1, wherein the electrostatic chuck is configured as an electrostatic chuck with low resistivity which uses the Johnsen-Rahbek effect.

3. The system of claim 1, wherein the transfer head includes a porous member having pores and transfers the micro LED by applying a vacuum to the pores or releasing the applied vacuum.

4. The system of claim 3, wherein the porous member includes an anodic oxide film formed by anodizing a metal.

5. The system of claim 3, wherein the porous member includes a first porous member and a second porous member,
wherein the first porous member vacuum-sucks the micro LED, and the second porous member is disposed between a vacuum chamber and the first porous member to transfer vacuum pressure of the vacuum chamber to the first porous member.

6. The system of claim 1, wherein the substrate is provided with a bonding pad at a position where the micro LED is attached.

7. The system of claim 6, wherein the bonding pad is configured as a metal layer.

8. The system of claim 6, wherein the bonding pad is configured as a non-metal layer.

9. The system of claim 1, wherein the substrate is configured as a circuit board.

10. A system for transferring a micro LED, the system configured to:
attach a substrate to an electrostatic chuck using an electrostatic force of the electrostatic chuck that is provided below the substrate;
move a transfer head that grips a micro LED above the substrate while the transfer head is spaced apart from the substrate;
apply the electrostatic force of the electrostatic chuck to the micro LED gripped by the transfer head in order to drop the micro LED onto the substrate; and
maintain the electrostatic force of the electrostatic chuck while the micro LED transferred to the substrate is attached to the substrate,
wherein the electrostatic chuck holds the substrate with the electrostatic force and applies the electrostatic force to the micro LED gripped by the transfer head to drop the micro LED onto the substrate.

11. A system for transferring a micro LED, the system comprising:
a transfer head transferring a micro LED;
a substrate to which the micro LED is transferred by the transfer head; and
an electrostatic chuck provided individually from the substrate to apply an electrostatic force to the micro LED,
wherein the electrostatic chuck holds the substrate with the electrostatic force and applies the electrostatic force to the micro LED gripped by the transfer head to drop the micro LED onto the substrate.

12. A system for transferring a micro LED, the system comprising:
a transfer head transferring a micro LED;
a substrate to which the micro LED is transferred by the transfer head; and
a magnetic chuck provided individually from the substrate and provided below the substrate to apply a magnetic force to the micro LED,
wherein the magnetic chuck holds the substrate with the magnetic force and applies the magnetic force to the micro LED gripped by the transfer head to drop the micro LED onto the substrate.

13. A system for transferring a micro LED, the system comprising:
a transfer head transferring micro LEDs with a first physical force;
a substrate to which the micro LEDs are transferred by the transfer head; and
a chuck applying a second physical force to the micro LEDs gripped by the transfer head,
wherein the chuck holds the substrate with the second physical force and applies the second physical force to the micro LED gripped by the transfer head to drop the micro LED onto the substrate.

14. The system of claim 13, wherein the first physical force is at least one of an electrostatic force, a magnetic force, and a suction force, and
the second physical force is at least one of an electrostatic force and a magnetic force.

15. The system of claim 13, wherein the substrate is held onto the chuck by the second physical force.

16. The system of claim 13, wherein the second physical force acts on all of the micro LEDs together.

17. The system of claim 13, wherein the second physical force acts on some of the micro LEDs.

18. The system of claim 13, wherein the second physical force is maintained while the micro LEDs are transferred to the substrate and attached to the substrate.

* * * * *